United States Patent
Huang et al.

(10) Patent No.: US 7,172,933 B2
(45) Date of Patent: Feb. 6, 2007

(54) RECESSED POLYSILICON GATE STRUCTURE FOR A STRAINED SILICON MOSFET DEVICE

(75) Inventors: Yi-Chun Huang, Pingjhen (TW);
Bow-Wen Chan, Hsin chu (TW);
Baw-Ching Perng, Hsin-Chu (TW);
Lawrence Sheu, Hsin-Chu (TW);
Hun-Jan Tao, Hsinchu (TW);
Chih-Hsin Ko, Fongshan (TW);
Chun-Chieh Lin, Hsinchu (TW)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 5 days.

(21) Appl. No.: 10/864,952

(22) Filed: Jun. 10, 2004

(65) Prior Publication Data
US 2006/0009001 A1    Jan. 12, 2006

(51) Int. Cl.
| H01L 21/336 | (2006.01) |
| H01L 21/8234 | (2006.01) |
| H01L 21/20 | (2006.01) |
| H01L 21/205 | (2006.01) |
| H01L 21/425 | (2006.01) |
| H01L 21/265 | (2006.01) |
| H01L 21/44 | (2006.01) |
| H01L 21/28 | (2006.01) |
| H01L 21/4763 | (2006.01) |
| H01L 21/3205 | (2006.01) |

(52) U.S. Cl. .................. 438/197; 438/289; 438/290; 438/299; 438/300; 438/301; 438/303; 438/305; 438/306; 438/307; 438/485; 438/486; 438/514; 438/518; 438/519; 438/521; 438/523; 438/524; 438/527; 438/529; 438/533; 438/570; 438/571; 438/576; 438/581; 438/585; 438/586; 438/589; 438/590; 438/592; 438/595; 438/597; 438/604; 438/607; 438/674; 438/682; 438/683; 438/685; 257/E21.428; 257/E21.419

(58) Field of Classification Search ............... 438/197, 438/289–290, 299–301, 303, 305–307, 483, 438/485–486, 514, 518–519, 521, 523–524, 438/527, 529, 533, 570–571, 576, 581, 583, 438/585–586, 589–590, 592, 595, 597, 604, 438/607, 674, 682–683
See application file for complete search history.

(56) References Cited

U.S. PATENT DOCUMENTS 5,461,243 A    10/1995    Ek et al.

(Continued)

OTHER PUBLICATIONS

Gluck, M., et al., "CoSi$_2$ and TiSi$_2$ for Si/SiGe Heterodevices", Elseyier Science S.A., 1995, pp. 549-554.
Krivokapic, Z., et al., "Nickel Silicide Metal Gate FDSOI Devices with Improved Gate Oxide Leakage"; IEEE 2002, 4 pages.

(Continued)

*Primary Examiner*—Michael Lebentritt
*Assistant Examiner*—Mohsen Ahmadi
(74) *Attorney, Agent, or Firm*—Haynes and Boone, LLP

(57) ABSTRACT

A method of forming a channel region for a MOSFET device in a strained silicon layer via employment of adjacent and surrounding silicon-germanium shapes, has been developed. The method features simultaneous formation of recesses in a top portion of a conductive gate structure and in portions of the semiconductor substrate not occupied by the gate structure or by dummy spacers located on the sides of the conductive gate structure. The selectively defined recesses will be used to subsequently accommodate silicon-germanium shapes, with the silicon-germanium shapes located in the recesses in the semiconductor substrate inducing the desired strained channel region. The recessing of the conductive gate structure and of semiconductor substrate portions reduces the risk of silicon-germanium bridging across the surface of sidewall spacers during epitaxial growth of the alloy layer, thus reducing the risk of gate to substrate leakage or shorts.

14 Claims, 5 Drawing Sheets

U.S. PATENT DOCUMENTS

| | | | |
|---|---|---|---|
| 6,429,061 | B1 | 8/2002 | Rim |
| 6,509,587 | B2 | 1/2003 | Sugiyama et al. |
| 6,605,512 | B2 | 8/2003 | Kiyota |
| 6,621,131 | B2 | 9/2003 | Murthy et al. |
| 6,872,610 | B1* | 3/2005 | Mansoori et al. ........... 438/197 |
| 6,878,592 | B1* | 4/2005 | Besser et al. ................ 438/285 |
| 6,924,182 | B1* | 8/2005 | Xiang et al. ................. 438/197 |
| 2005/0079692 | A1* | 4/2005 | Samoilov et al. ........... 438/481 |
| 2005/0139872 | A1* | 6/2005 | Chidambaram et al. .... 257/288 |

OTHER PUBLICATIONS

Nayak, D. K., et al., "Enhancement-Mode Quantum-Well $Ge_xSi_{1-x}$ PMOS", IEEE, vol. 12, No. 4, Apr. 1991, pp. 154-156.

Xiang, Qi, et al., "Strained Silicon NMOS with Nickel-Silicide Metal Gate", Symposium on VLSI Tehcnology Digest of Technical Papers, 2003, 2 pages.

Yeo, Yee-Chia, et al., "Enhanced Performance in Sub-100 nm CMOSFETs Using Strained Epitaxial Silicon-Germanium", IEDM, 2000, 4 pages.

* cited by examiner

RECESSED POLYSILICON GATE STRUCTURE FOR A STRAINED SILICON MOSFET DEVICE

BACKGROUND OF THE INVENTION

The present invention relates to methods used to fabricate semiconductor devices and more specifically to a method of fabricating a metal oxide semiconductor field effect (MOSFET) device featuring a channel region in a strained silicon region.

The ability to establish a channel region in a strained silicon region has allowed the performance of MOSFET devices to be enhanced. The increased mobility of carriers in the strained silicon region translates to increased drive currents thus enhanced device performance. Various options for creating the strained silicon region, or a silicon region under compressive strain, have been used such as forming the strained silicon layer directly on an underlying, relaxed silicon-germanium layer. Another option, practiced in the present invention, is the selective growth of relaxed silicon-germanium regions in an area of a semiconductor substrate to subsequently be used to accommodate a source/drain region. This option allows a strained silicon region, to be used to accommodate the MOSFET channel region, to be formed in a top portion of a semiconductor substrate located between the silicon-germanium regions. However, the selective growth of silicon-germanium has to be performed after definition of a conductive gate structure, and after insulator spacers have been defined on the sides of the conductive gate structure. The procedure used to grow silicon-germanium on regions of a semiconductor substrate wherein subsequent source/drain formation will occur, also results in silicon-germanium growth on the exposed top surface of a conductive gate structure. The growth of silicon-germanium on both type surfaces can however result in unwanted bridging of silicon-germanium across the insulator spacers possibly resulting in unwanted gate to substrate leakage or shorts.

SUMMARY OF THE INVENTION

It is an object of this invention to fabricate a metal oxide semiconductor field effect transistor (MOSFET) device wherein the MOSFET channel region is located in a strained silicon region.

It is another object of this invention in a first embodiment, to employ dummy sidewall spacers on the sides of a conductive gate structure followed by recessing of a top portion of the conductive gate structure and recessing of the portions of a semiconductor substrate not covered by the conductive gate structure or by the dummy sidewall spacers, wherein the recessing procedure is performed prior to growth of silicon-germanium, while a second embodiment of this invention performs the recessing procedure after formation of a lightly doped source/drain region and after formation of sidewall spacers on the sides of the conductive gate structure.

It is still another object of this invention to form silicon-germanium regions in the recessed top portion of the conductive gate structure and in recessed portions of a semiconductor substrate, areas of the semiconductor substrate in which a subsequent source/drain region will be located in, resulting in a strained silicon region located between the silicon-germanium regions.

In accordance with the present invention, a MOSFET channel region formed in a strained silicon region, wherein strained silicon region in turn is formed in an area of a semiconductor substrate located adjacent to silicon-germanium regions, is described. After formation of a conductive gate structure on an underlying gate insulator layer, a first embodiment of this invention entails the definition of dummy insulator spacers on the sides of the conductive gate structure. A dry etch procedure is employed to recess a top portion of the conductive gate structure as well as to recess portions of the semiconductor substrate not covered by the conductive gate structure or by the dummy insulator spacers. Deposition of a silicon-germanium layer results in filling of the recess in the top portion of the conductive gate structure as well as forming silicon-germanium regions in the recessed portions of the semiconductor substrate. The silicon-germanium regions located in the recesses in the semiconductor substrate allow a strained silicon region to be formed in a top portion of the semiconductor substrate located underlying the conductive gate structure. After removal of the dummy insulator spacers, a lightly doped source/drain (LDD) region is formed in an area of the semiconductor substrate not covered by the conductive gate structure, followed by definition of insulator spacers on the sides of the conductive gate structure. Formation of a heavily doped source/drain region is next accomplished in an area of the silicon-germanium regions, as well as in an underlying area of the semiconductor substrate not covered by the conductive gate structure or by the insulator spacers. Formation of silicon shapes on silicon-germanium regions is followed by formation of metal silicide regions on the same silicon shapes. A second embodiment of this invention entails formation of an LDD region after definition of the conductive gate structure followed by formation of dummy insulator spacers on the sides of the conductive gate structure. After recessing of exposed portions of the semiconductor substrate and of the conductive gate structure a silicon-germanium layer is again used to selectively fill the recesses. Formation of a heavily doped source/drain region is followed by formation of silicon shapes on the silicon-germanium regions followed by formation of metal silicide using the underlying silicon shapes as a silicon source.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
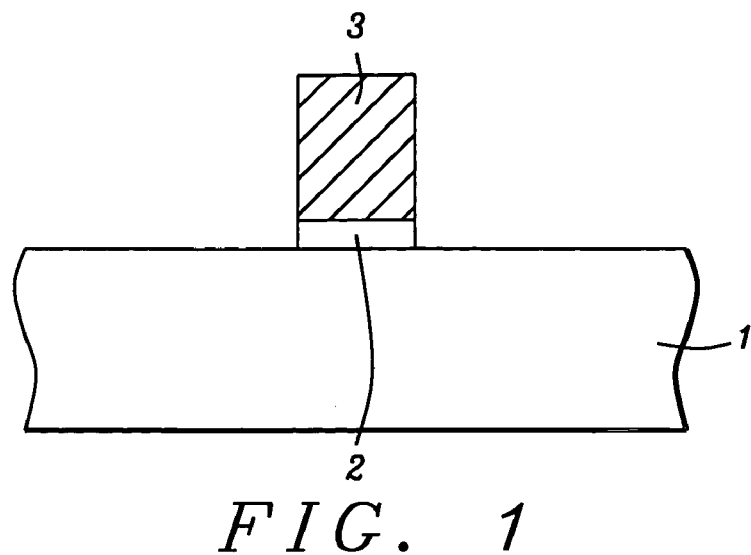
FIGS. 1–8, which schematically in cross-sectional style describe key stages of a first process sequence used to fabricate a MOSFET device featuring a channel region located in a strained silicon region, wherein the strained silicon region was created by being located between adjacent silicon-germanium regions.

The method of forming a MOSFET device featuring a channel region located in a strained silicon region, wherein the strained silicon region was created by adjacent silicon-germanium regions in turn located in recesses in a semiconductor substrate, will now be described in detail. Semiconductor substrate 1, comprised of P type single crystalline silicon, featuring a <100> crystallographic orientation, is used and schematically shown in FIG. 1. Gate insulator layer 2, comprised of silicon dioxide, is next obtained at a thickness between about 10 to 150 Angstroms, via thermal oxidation procedures. A conductive layer such as a doped polysilicon layer, is next obtained via low pressure chemical vapor deposition (LPCVD) procedures at a thickness between about 500 to 3000 Angstroms. The polysilicon layer can be doped in situ during deposition via the addition of arsine or phosphine to a silane ambient, or the polysilicon layer can be deposited intrinsically then doped via implantation of arsenic or phosphorous ions. A photoresist shape, not shown in the drawings, is used as an etch mask to allow an anisotropic reactive ion etch (RIE) procedure to selectively define conductive gate structure 3, using $Cl_2$ as a selective etchant with the RIE procedure terminating at the appearance of the top surface of gate insulator layer 2. Conductive gate structure 3 is defined with a width between about 10 nm to 2.5 um. Removal of the photoresist shape is accomplished via plasma oxygen ashing followed by a final wet procedure featuring a dilute hydrofluoric (DHF) cycle which removes the portions of gate insulator 2, not covered by conductive gate structure 3. The result of the above procedures is schematically shown in FIG. 1.

Figure 2:
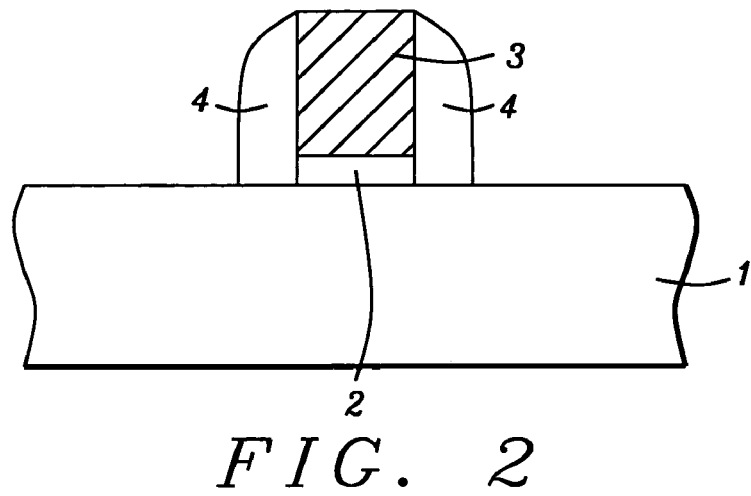

A first embodiment of this invention begins with formation of dummy insulator spacers 4, on the sides of conductive gate structure 3. This is accomplished via deposition of an insulator layer such as silicon nitride at a thickness between about 30 to 3000 Angstroms, via LPCVD or via low pressure chemical vapor deposition (PECVD) procedures. A selective, anisotropic RE procedure, performed using $CHF_3$, $CH_2F_2$ or $CF_4$ as an etchant for silicon nitride, is next employed to define dummy insulator spacers 4, on the sides of conductive gate structure 3. This is schematically shown in FIG. 2.

Figure 3:
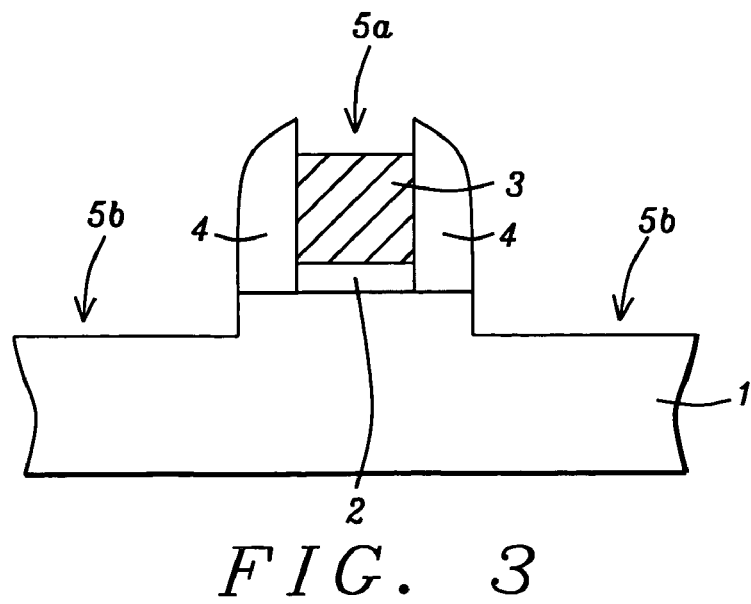

An objective of this invention is to form a channel region in a strained silicon region via surrounding a silicon region with adjacent, relaxed silicon-germanium shapes, with the difference in stress between silicon-germanium and silicon creating the desired strained silicon region between the silicon-germanium shapes. However if silicon-germanium was now epitaxially grown, in addition to silicon-germanium growth on exposed portions of semiconductor substrate 1, silicon-germanium will also grow on the exposed surfaces of conductive gate structure 3, possibly resulting in bridging of silicon-germanium occurring on dummy insulator spacers 4, subsequently resulting in unwanted gate to substrate leakage or shorts. Therefore a critical step, recessing of the conductive gate structure is employed to reduce the risk of subsequent silicon-germanium bridging. A selective RIE procedure is therefore now used to remove between about 100 to 1000 Angstroms of conductive gate structure 3, resulting in recess 5a, located in a top portion of conductive gate structure 3. The selective RIE procedure, performed using $Cl_2$ or HBr as an etchant, also results in removal of the top portions of semiconductor substrate 1, not covered by conductive gate structure 3, or by dummy spacers 4, resulting in recesses 5b, at a depth between about 100 to 1000 Angstroms in semiconductor substrate 1. This is schematically shown in FIG. 3.

Figure 4:
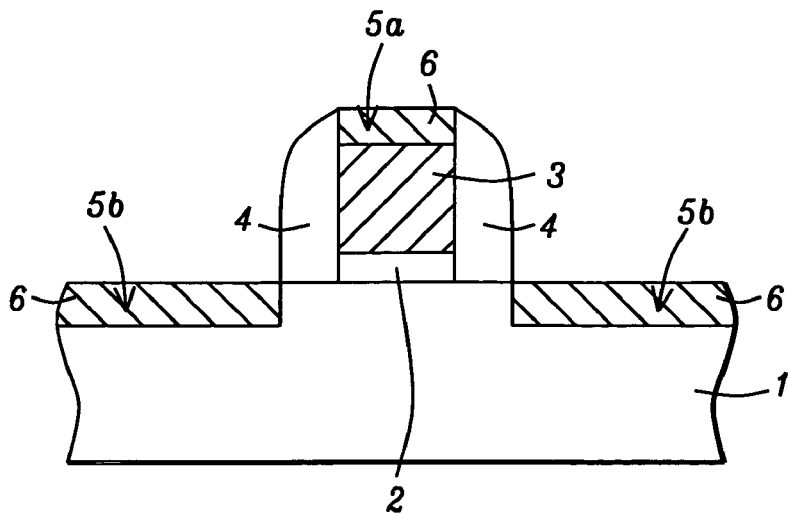

Formation of silicon-germanium shapes 6 in recess 5a, in conductive gate structure 3, and in recesses 5b, in semiconductor substrate 1, are next addressed and schematically described in FIG. 4. A selective epitaxial growth procedure performed at a temperature between about 800 to 1100° C., using silane or disilane, and germane, results in the selective growth of silicon-germanium shapes 6. Silicon-germanium shapes 6, grown at a thickness between about 100 to 1000 Angstroms, are formed in recess 5a, in conductive gate structure 3, as well as in recesses 5b. The selectivity of the epitaxial growth procedure does not allow silicon-germanium growth on insulator surfaces, such as the surface of the dummy insulator spacers 4. The weight percent of germanium in the silicon-germanium alloy shapes is between about 0 to 50%. The critical feature of this process sequence is the intentionally formed recess in the top portion of conductive gate structure 3, preventing silicon-germanium growth from extending downwards from the conductive gate structure along the surface of the dummy insulator spacers. Thus the risk of gate to substrate shorts which can occur with silicon-germanium bridging is reduced as a result of the recess in the top portion of conductive gate structure 3, as well as a result of the selective silicon-germanium epitaxial growth procedure. If desired other silicon alloy shapes such as silicon-germanium-carbon shapes, can be used in place of silicon-germanium.

Figure 5:
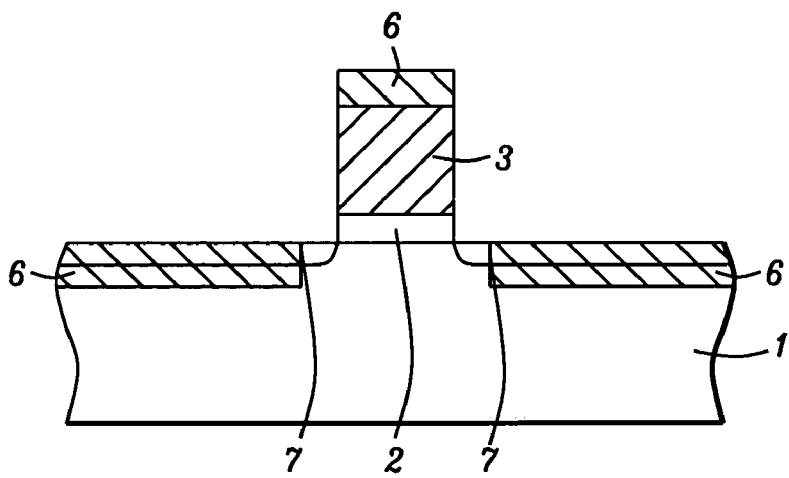

Dummy insulator spacers 4, are now selectively removed via use of a hot phosphoric acid bath, or via a selective dry etch procedure using $CF_4$ as an etchant for the silicon nitride of dummy insulator spacers 4. An ion implantation procedure is next performed using arsenic or phosphorous ions at an energy between about 5 to 50 KeV, at a dose between about 5E13 to 5E14 atoms/$cm^2$, resulting in the formation of lightly doped source/drain (LDD) region 7, in top portions of silicon-germanium region 6, and in portions of semiconductor substrate 1, not covered by conductive gate structure 3. This is schematically shown in FIG. 5.

Figure 6:
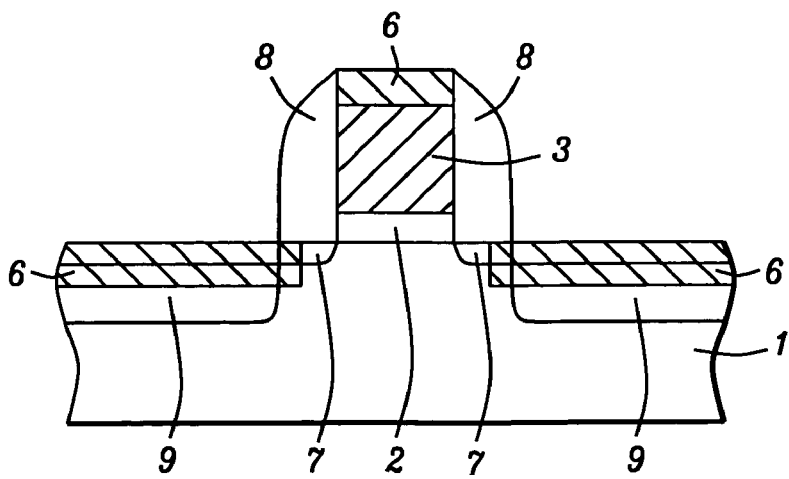

Formation of insulator spacers 8, are next addressed and schematically shown using FIG. 6. An insulator layer such as silicon oxide or silicon nitride is next deposited to a thickness between about 400 to 2500 Angstroms, via LPCVD or via PECVD procedures. A selective, anisotropic RIE procedure, performed using $CF_4/CHF_3/CH_2F_2$ as a selective etchant for silicon oxide or silicon nitride, allows definition of insulator sidewall spacers 8, to be formed on the sides of conductive gate structure 3. With insulator spacers 8, ion implantation of arsenic or phosphorous ions is performed at an energy between about 20 to 60 KeV, at a dose between about 5E14 to 5E15 atoms/$cm^2$, resulting in heavily doped source/drain region 9, located in portions of semiconductor substrate 1, not covered by conductive gate structure 3, or by insulator spacers 8. This is schematically shown in FIG. 6.

Figure 7:
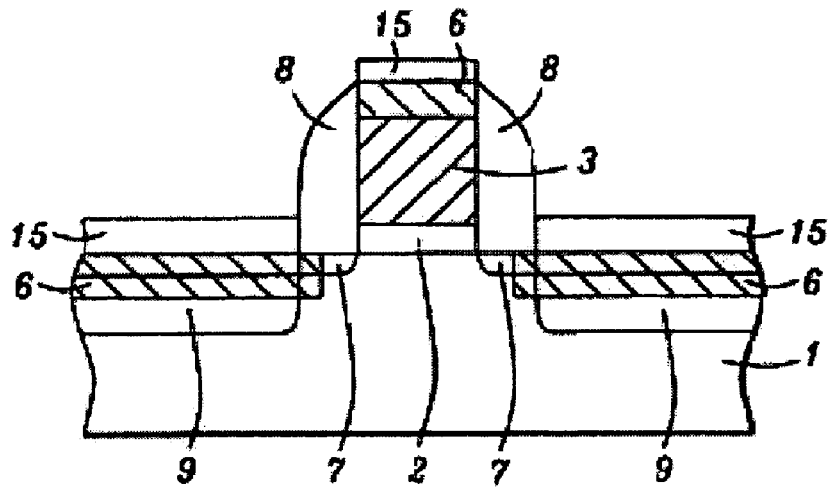
Figure 8:
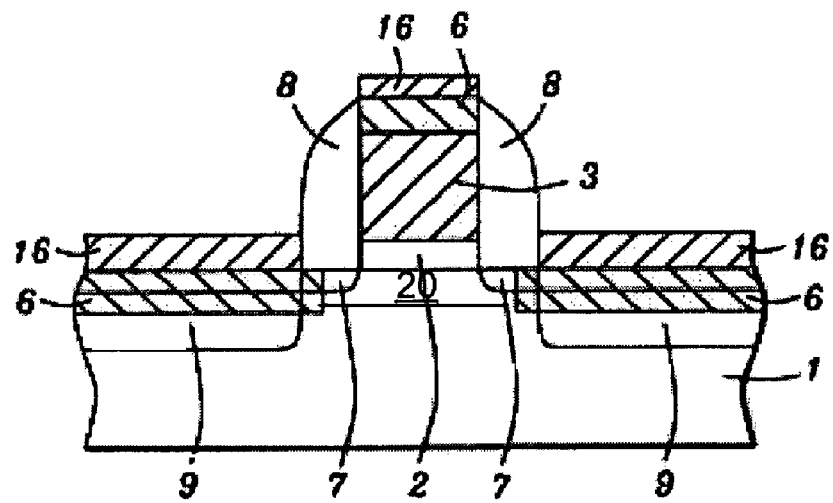

To accommodate subsequent desired metal silicide regions without disturbing or removing silicon-germanium regions silicon shapes 15, are selectively formed on silicon-germanium shapes 6. This is accomplished via a selective epitaxial growth procedure performed at a temperature between about 800 to 1050° C., using silane or disilane, in a hydrogen environment, resulting in silicon shapes 15, at a thickness between about 100 to 1000 Angstroms, located on the silicon-germanium shapes which in turn are located in the recess in conductive gate structure 3, and in the recesses in semiconductor substrate 1. This is schematically shown in FIG. 7. A metal layer such as titanium, tungsten, tantalum, nickel, zirconium or cobalt is next deposited via physical vapor deposition (PVD) procedures, at a thickness between about 150 to 1000 Angstroms. An anneal procedure, such as a rapid thermal anneal (RTA) is performed at a temperature between about 300 to 850° C., resulting in the selective formation of metal silicide regions 16, only on regions in which the metal layer overlaid silicon shapes 15. Regions in which the metal layer overlaid insulator, such insulator spacers 8, remain unreacted and are selectively removed via selective wet etch procedures which do not etch metal silicide. This is schematically shown in FIG. 8.

The region 20 of semiconductor substrate 1, located between silicon-germanium shapes which in turn are located in the recesses in semiconductor substrate 1, is now in a strained configuration, allowing the device channel region to be located in this strained silicon portion. The ability to have a channel region in a strained silicon region results in increased carrier mobility thus increasing the performance of the MOSFET device when compared to counterpart devices in which a channel region is not located in strained material.

Figure 9:
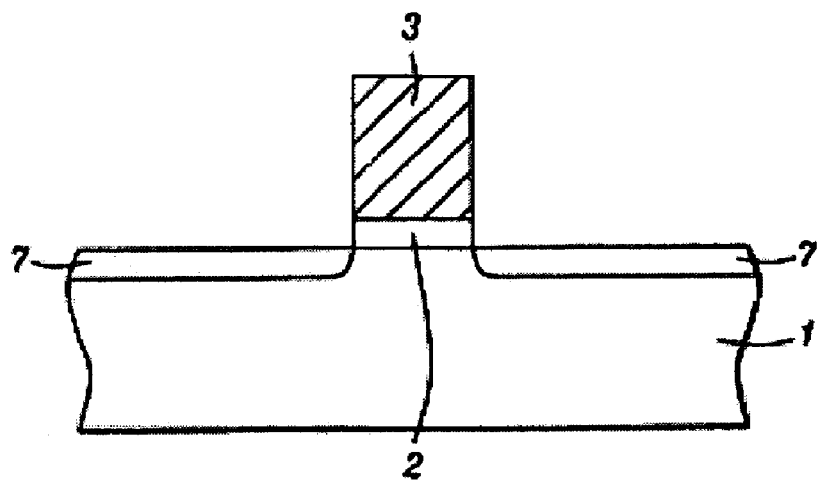
FIGS. 9–13, which schematically in cross-sectional style describe key stages of a second process sequence used to fabricate a MOSFET device featuring a channel region located in a strained silicon region, wherein the strained silicon region was created by being located between adjacent silicon-germanium regions

A second embodiment of this invention, again with the objective of creating a strained region 20 (shown in FIG. 13) in a semiconductor substrate, via surrounding the desired semiconductor region with adjacent silicon-germanium shapes, will now be described. Conductive gate structure 3, and underlying gate insulator layer 2, are again formed to the same thicknesses used for counterpart conductive gate structure and gate insulator layer of the first embodiment of this invention. Lightly doped source/drain (LDD) region 7, is again formed via implantation of arsenic or phosphorous ions at an energy between about 5 to 50 KeV, at a dose between about 5E13 to 5E14 atoms/cm$^2$, resulting in the formation of lightly doped source/drain (LDD) region 7, in portions of semiconductor substrate 1, not covered by conductive gate structure 3. This is schematically shown in FIG. 9.

Figure 10:
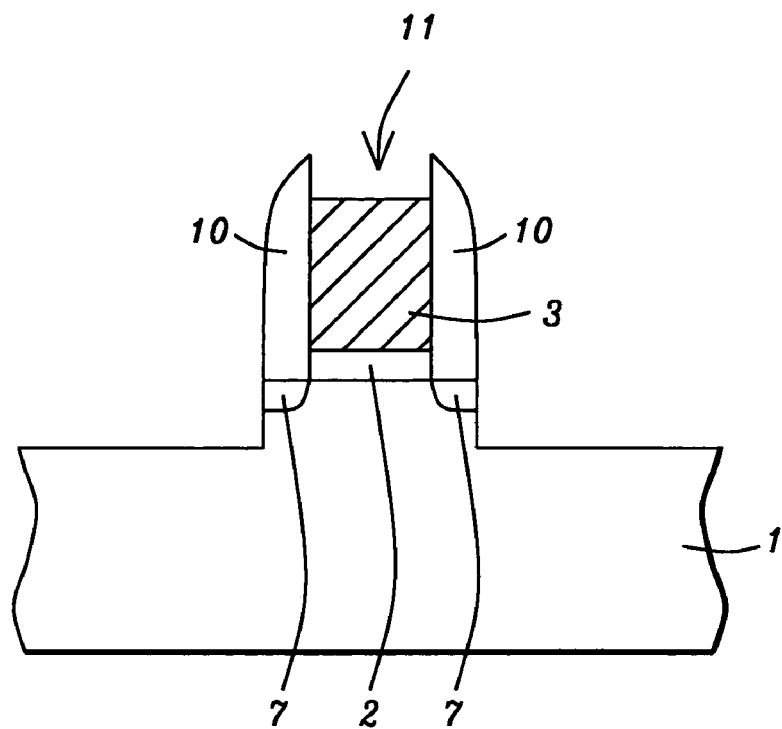

Formation of insulator spacers 10, is next addressed. An insulator layer such as silicon nitride or silicon oxide is first deposited to a thickness between about 400 to 2500 Angstroms via LPCVD or via PECVD procedures. A selective, anisotropic RIE procedure is next performed using $CF_4$ as an etchant for silicon nitride, or using $CHF_3$ as a selective etchant for silicon oxide, resulting in definition of insulator sidewall spacers 10, on the sides of conductive gate structure 3. With insulator spacers 10 in place, recessing of exposed portions of conductive gate structure 3, and of semiconductor substrate 1, is accomplished. A selective RIE procedure is used to remove between about 100 to 1000 Angstroms of conductive gate structure 3, and of semiconductor substrate 1, resulting in recesses 11, located in a top portion of both conductive gate structure 3, and semiconductor substrate 1. The selective RIE procedure is performed using $Cl_2$ or $SF_6$ as an etchant. LDD region 7, located underlying insulator spacers 10, is protected during the recessing procedure. This is schematically shown in FIG. 10.

Figure 11:
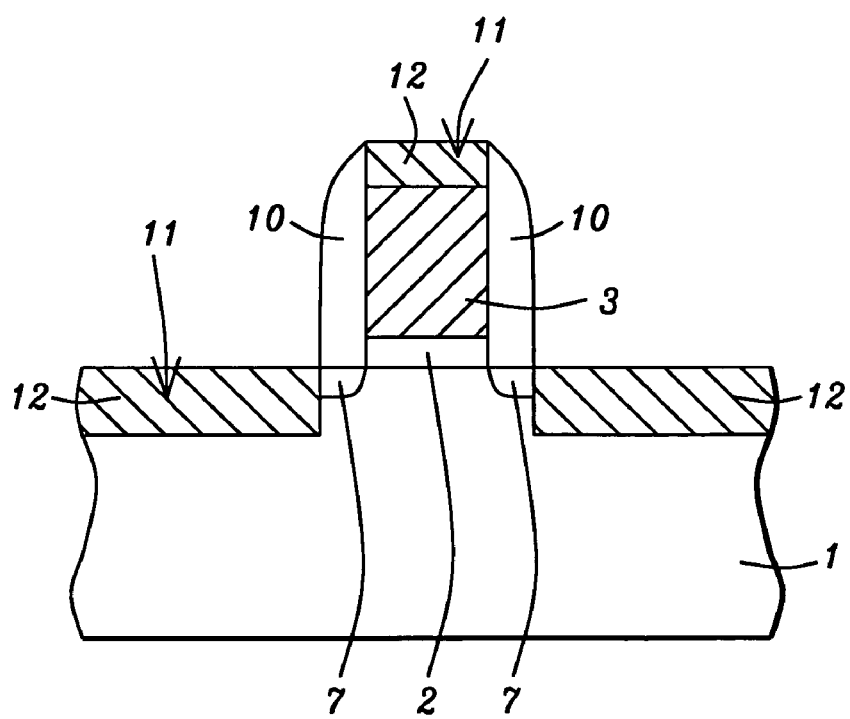

Formation of silicon-germanium shapes 12, in recesses 11, in conductive gate structure 3, as well as in semiconductor substrate 1, are next addressed and schematically described in FIG. 11. A selective epitaxial growth procedure is again performed at a temperature between about 800 to 1100° C., using silane or disilane, and germane, resulting in the selective growth of silicon-germanium shapes 12. Silicon-germanium shapes 12, grown at a thickness between about 100 to 1000 Angstroms, are formed in recesses 11, located in both conductive gate structure 3, and in semiconductor substrate 1. The selectivity of the epitaxial growth procedure does not allow silicon-germanium growth on insulator surfaces so that silicon-germanium bridging, from the conductive gate structure to the semiconductor substrate will not occur.

Figure 12:
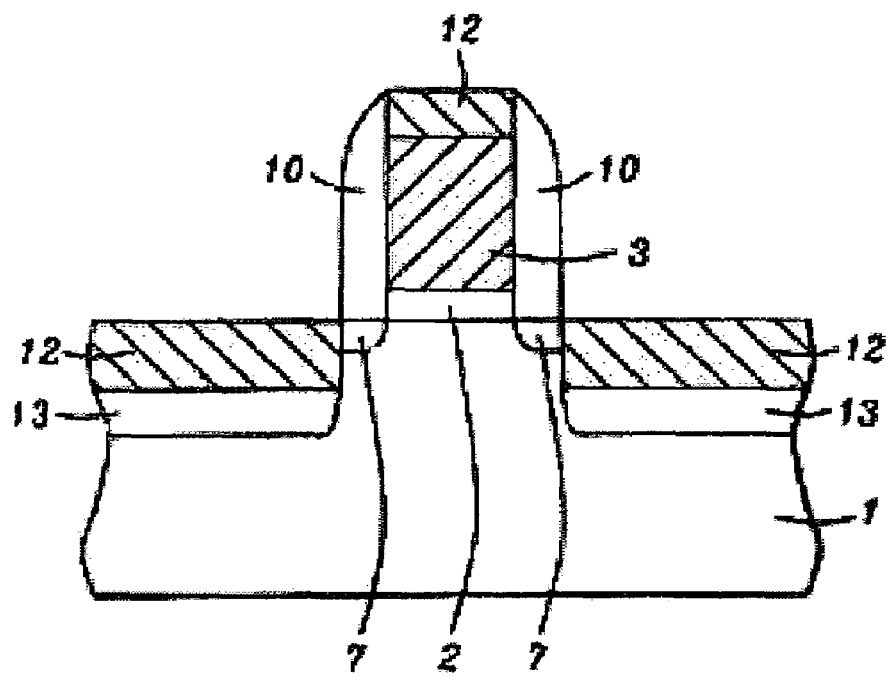

Formation of heavily doped source/drain region 13, is next accomplished via implantation of arsenic or phosphorous ions at an energy between about 20 to 60 KeV, at a dose between about 5E14 to 5 E15 atoms/cm$^2$. Heavily doped source/drain region 13, schematically shown in FIG. 12, is formed in portions of semiconductor substrate not covered by conductive gate structure 3, or by insulator spacers 10.

Figure 13:
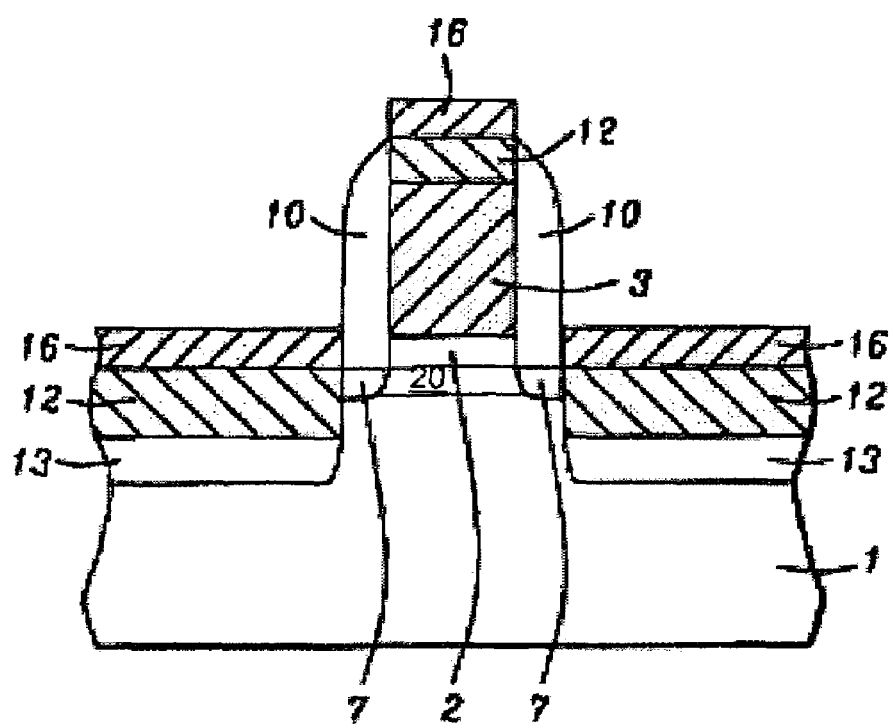

Formation of metal silicide regions 16, shown schematically in FIG. 13, located on silicon-germanium shapes 12, is accomplished using identical processes and materials used to form metal silicide regions in the first embodiment of this invention. That is selective growth of silicon shapes on underlying silicon-germanium shapes, followed by metal deposition and an anneal procedure forming the desired metal silicide using the underlying silicon shapes as a silicon source.

The identical objective of forming a strained region 20 in a portion of a semiconductor substrate, using adjacent silicon-germanium shapes, has been accomplished using either the first or second embodiment of this invention. While the first embodiment employs a dummy as well as a permanent insulator sidewall spacer, and with the LDD region formed prior to formation of the permanent insulator sidewall spacer, the second embodiment captures the same objective using only a permanent insulator sidewall spacer with the LDD region formed prior to definition of the permanent insulator sidewall spacer.

While this invention has been particularly shown and described with reference to the preferred embodiments thereof, it will be understood by those skilled in the art that various changes in form and details may be made without departing from the spirit or scope of the invention.

What is claimed is:

1. A method comprising:
   forming a gate structure having an insulator layer on a substrate;
   forming dummy spacers on sidewalls of the gate structure;
   forming a first recess in a top portion of the gate structure and forming second and third recesses in the substrate on either side of the gate structure uncovered by the dummy spacers;
   forming silicon-germanium in the second and third recesses;
   removing the dummy spacers; and
   forming source and drain regions on either side of the gate structure, wherein a stress difference between the silicon-germanium and the substrate results in a strained silicon region between the silicon-germanium in the second and third recesses.

2. The method of claim 1, further comprising forming insulator spacers on sidewalls of the gate structure prior to forming the source and drain regions.

3. The method of claim 1, further comprising forming silicon-germanium in the first recess.

4. The method of claim 1, wherein forming source and drain regions comprises:
   forming lightly doped drain regions on either side of the gate structure; and
   forming more heavily doped regions on either side of the gate structure.

5. The method of claim 1, wherein forming a gate structure comprises:
   forming an insulative layer on the substrate; and
   forming a conductive layer on the insulative layer.

6. The method of claim 1, wherein forming the first, second and third recesses comprising etching.

7. The method of claim 1, wherein forming the first, second and third recesses comprising selectively etching the gate structure and the substrate uncovered by the dummy spacers.

8. A method comprising:
forming a gate structure on a substrate;
forming insulator spacers on sidewalls of the gate structure;
forming a first recess in a conductive layer of the gate structure and forming second and third recesses in the substrate on either side of the gate structure uncovered by the insulator spacers;
forming source and drain regions on either side of the gate structure uncovered by the insulator spacers; and
forming a strained semiconductor region in the substrate under the gate structure.

9. The method of claim 8, wherein forming source and drain regions comprises:
forming lightly doped regions in the substrate on either side of the gate structure prior to forming the insulator spaces; and
forming heavily doped regions in the substrate on either side of the gate structure uncovered by the insulator spacers.

10. The method of claim 8, wherein forming the strained semiconductor region comprises forming a silicon germanium layer over the substrate between the second and third recesses.

11. The method of claim 8, wherein forming a gate structure comprises:
forming an insulative layer on the substrate; and
forming a conductive layer on the insulative layer.

12. The method of claim 8, wherein forming the first, second and third recesses comprises etching.

13. The method of claim 8, wherein forming the first, second and third recesses comprises selectively etching the gate structure and the substrate uncovered by the dummy spacers.

14. The method of claim 8, further comprising forming a silicon-germanium layer in the first recess.

\* \* \* \* \*